US010823777B2

(12) United States Patent
Dase et al.

(10) Patent No.: US 10,823,777 B2
(45) Date of Patent: Nov. 3, 2020

(54) DETECTION AND LOCATION OF BROKEN CONDUCTORS FOR TRANSMISSION LINES

(71) Applicant: Schweitzer Engineering Laboratories, Inc., Pullman, WA (US)

(72) Inventors: Kanchanrao Gangadhar Dase, Pullman, WA (US); Sajal Kumar Harmukh, Pullman, WA (US); Arunabha Chatterjee, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 112 days.

(21) Appl. No.: 16/371,910

(22) Filed: Apr. 1, 2019

(65) Prior Publication Data

US 2019/0317143 A1 Oct. 17, 2019

Related U.S. Application Data

(60) Provisional application No. 62/658,363, filed on Apr. 16, 2018.

(51) Int. Cl.
*G01R 31/08* (2020.01)
*G01R 19/165* (2006.01)

(52) U.S. Cl.
CPC ......... *G01R 31/085* (2013.01); *G01R 19/165* (2013.01)

(58) Field of Classification Search
CPC .......... G01R 19/165; H02H 5/10; H02H 3/38
See application file for complete search history.

(56) References Cited

U.S. PATENT DOCUMENTS

| 4,297,740 | A | 10/1981 | Hagberg |
| 4,600,961 | A | 7/1986 | Bishop |
| 5,883,578 | A | 3/1999 | Roberts |
| 6,573,726 | B1 | 6/2003 | Roberts |
| 6,833,711 | B1 | 12/2004 | Hou |
| 7,720,619 | B2 | 5/2010 | Hou |
| 7,945,400 | B2 | 5/2011 | Hou |
| 8,289,668 | B2 | 10/2012 | Kasztenny |
| 8,581,723 | B2 * | 11/2013 | Schweitzer, III ........ H02G 1/02 340/539.26 |
| 9,160,158 | B2 | 10/2015 | Schweitzer |

(Continued)

FOREIGN PATENT DOCUMENTS

WO 2014/018909 1/2014

OTHER PUBLICATIONS

William O'Brien, et Al. "Catching Falling Conductors in Midair—Detecting and Tripping Broken Distribution Circuit Conductors at Protection Speeds" Presented at the 42nd Annual Western Protective Relay Conference, Oct. 2015.

*Primary Examiner* — Alvaro E Fortich
(74) *Attorney, Agent, or Firm* — Bradley W. Schield

(57) ABSTRACT

The present disclosure relates to detecting a broken conductor in a power transmission line. In an embodiment, a processor receives a signal indicating current on the transmission line. The processor determines that a broken conductor is present on the transmission line based at least in part on a magnitude of the current being less than a line charging current of the transmission line and a phase angle of the current leading a respective phase voltage of the transmission line. The processor effects a control operation based on the determined broken conductor.

22 Claims, 7 Drawing Sheets

(56) References Cited

U.S. PATENT DOCUMENTS

| | | |
|---|---|---|
| 9,413,156 B2 | 8/2016 | O'Brien |
| 9,509,399 B2 * | 11/2016 | Kasztenny ........... H04B 10/032 |
| 9,568,516 B2 | 2/2017 | Gubba Ravikumar |
| 10,340,684 B2 | 7/2019 | Sridharan |
| 2005/0057212 A1 | 3/2005 | Harbaugh |
| 2005/0231871 A1 | 10/2005 | Karimi |
| 2007/0055889 A1 | 3/2007 | Henneberry |
| 2008/0211511 A1 | 9/2008 | Choi |
| 2011/0075304 A1 | 3/2011 | Hamer |
| 2012/0068717 A1 | 3/2012 | Gong |
| 2012/0330582 A1 | 12/2012 | Wiszniewski |
| 2013/0107405 A1 | 5/2013 | Blumschein |
| 2014/0028116 A1 | 1/2014 | O'Brien |
| 2015/0124358 A1 | 5/2015 | Hulse |
| 2016/0041216 A1 | 2/2016 | Tang |
| 2016/0091537 A1 | 3/2016 | Gaarder |
| 2016/0266193 A1 | 9/2016 | Ennis |
| 2016/0299187 A1 | 10/2016 | Liang |
| 2016/0308349 A1 | 10/2016 | Sridharan |
| 2018/0284180 A1 * | 10/2018 | Ha ......................... H02H 3/405 |

* cited by examiner

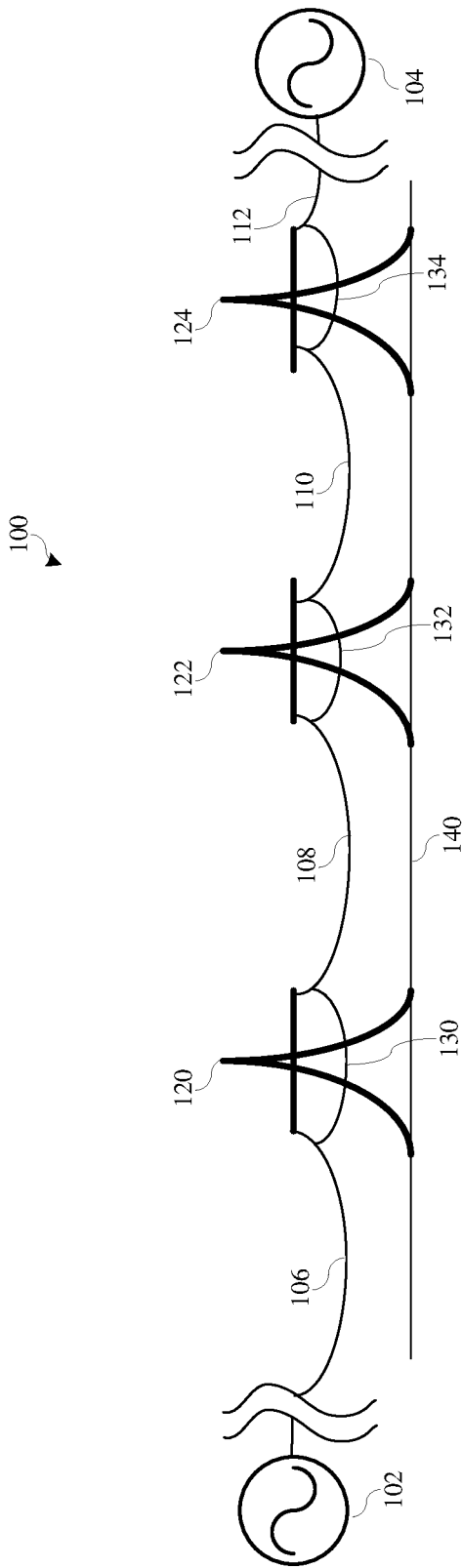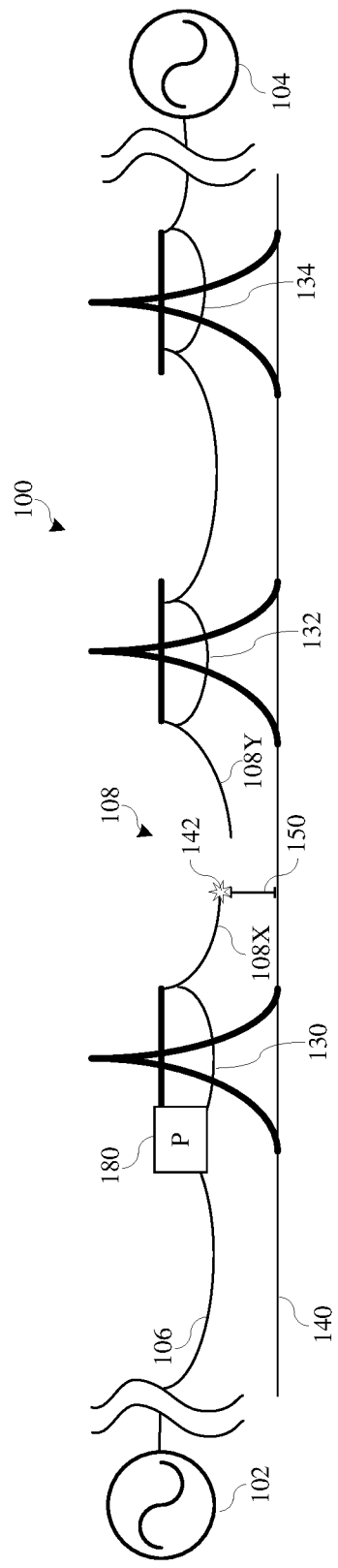

US 10,823,777 B2

DETECTION AND LOCATION OF BROKEN CONDUCTORS FOR TRANSMISSION LINES

RELATED APPLICATION

The present disclosure claims the benefit under 35 U.S.C. § 119(e) of U.S. Provisional Patent Application No. 62/658,363 entitled "Detection and Location of Broken Conductors for Transmission Lines", filed Apr. 16, 2018, which is herein incorporated by reference in its entirety and for all purposes.

TECHNICAL FIELD

The present disclosure relates generally to electric power delivery systems and, more particularly, to detecting and locating broken conductors on transmission lines.

BRIEF DESCRIPTION OF THE DRAWINGS

Non-limiting and non-exhaustive embodiments of the disclosure are described herein, including various embodiments of the disclosure with reference to the figures listed below.

FIG. 1 is a one-line diagram of a power transmission system, in accordance with an embodiment.

FIG. 2 is a one-line diagram of the power transmission system of FIG. 1 having an intelligent electronic device (IED) that detects a broken conductor, in accordance with an embodiment.

DETAILED DESCRIPTION OF SPECIFIC EMBODIMENTS

Figure 3:
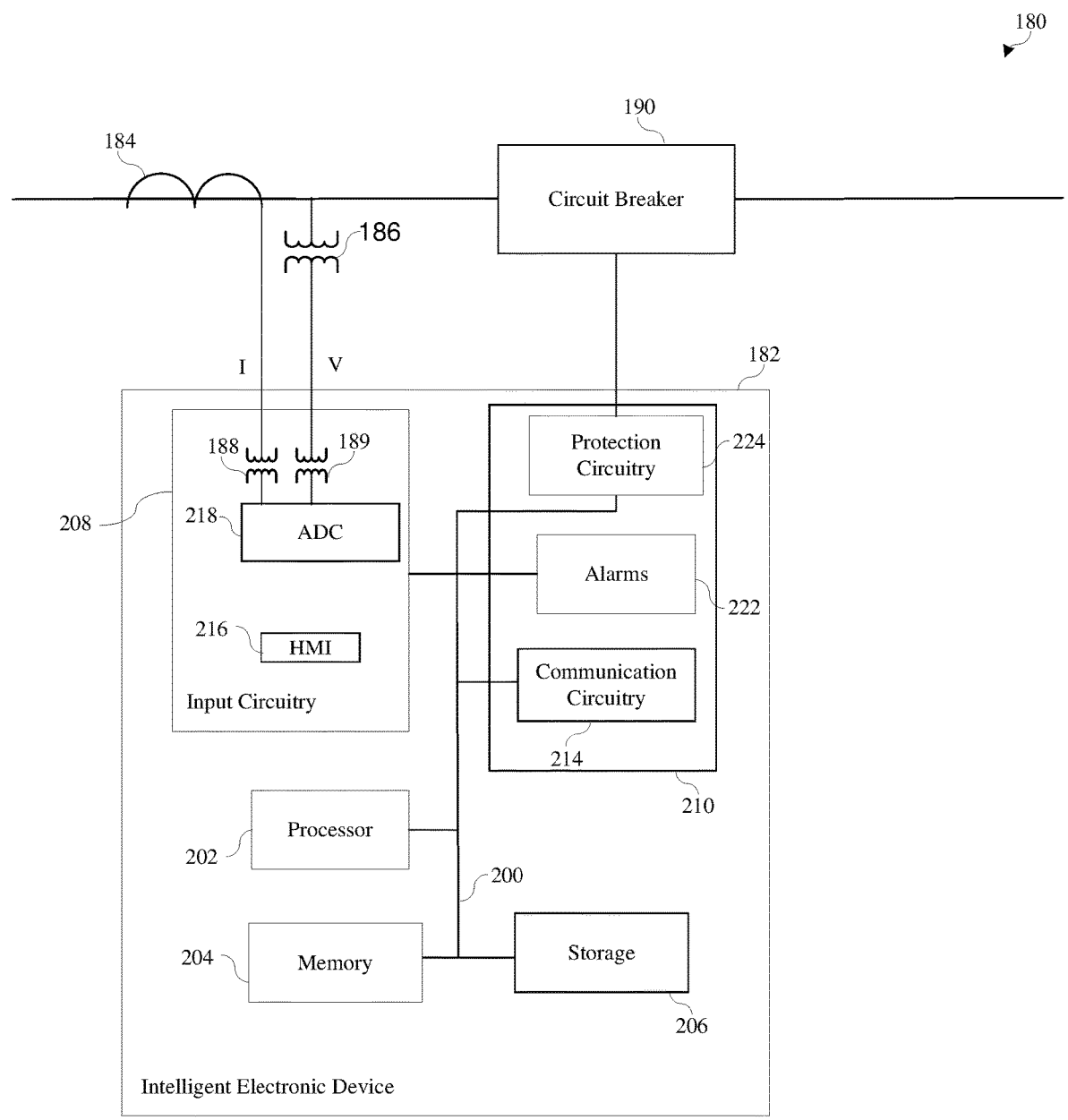
FIG. 3 is a block diagram of the IED of FIG. 2, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power lines may be used to provide electrical energy from a source (such as, for example, a utility source, a generator, a distributed generator, or the like) to one or more loads. Transmission lines may include one or more conductors to conduct electricity between the source and the loads. Transmission lines are often installed on overhead structures or buried underground. However, due to aging and/or environmental conditions, such as wind, rain, animals, or vehicles, a broken conductor in a transmission line may occur. Broken conductors may include a broken transmission line, a broken jumper, a broken connection therebetween, or any other suitable physical discontinuity in the conductors of the transmission system. Further, such broken conductors may pose safety threats, cause fires, or disrupt power delivery. For the foregoing reasons, systems and methods to detect broken conductors are described below.

In an embodiment, a system may utilize current magnitude detected and a phase difference of a current with respect to a voltage to determine whether a broken conductor is present. A system for detecting a broken conductor in a transmission line of a power transmission system may include a processor communicatively coupled to a memory. The processor may receive a signal indicating current and voltage on the transmission line. The processor may determine that a broken conductor is present on the transmission line based at least in part on a magnitude of the current being less than a line charging current of the transmission line and a phase difference between the current and voltage with the current leading a voltage by approximately 90 degrees. The processor may effect a control operation based on the determined broken conductor.

FIG. 1 illustrates a simplified one-line diagram of an embodiment of an electric power transmission system 100 in which power is transmitted from one or more sources 102 and 104, such as electrical utilities, towards one or more loads via power transmission lines 106, 108, 110, and 112. While a bi-directional embodiment is described below, other power transmission systems may be radial (e.g., from source to load) in accordance with various embodiments. Further, in some embodiments, the electric power transmission system 100 may change dynamically depending on the operating conditions. The power transmission lines 106, 108, 110, and 112 may each include one or more conductors to conduct current from the sources 102 and 104 to the loads. Each of the power transmission lines 106, 108, 110, and 112 is suspended from structures 120, 122, and 124, such as towers, poles, and the like, to be above ground 140. Each of the power transmission lines 106, 108, 110, and 112 may include one or more respective conductors to conduct electrical energy from the source to the loads.

In the illustrated embodiment, the power transmission line 106 is electrically coupled to the power transmission line 108 via the jumper 130; the power transmission line 108 is electrically coupled to power transmission line 110 via the jumper 132; and, the power transmission line 110 is electrically coupled to the power transmission line 112 via the jumper 134. Each of the jumpers 130, 132, and 134 may have an electrical conductor to allow current to flow between each power transmission line 106, 108, 110, and 112. Further, note that while a single phase is shown, the transmission system may include, for example, a three phase transmission system or any other suitable number of phases. In three phase transmission systems, each phase of the transmission system in one section may be electrically coupled to a respective phase of the three phases on the next section of the transmission system via a respective jumper. As mentioned above, due to various environmental conditions and/or aging, a broken conductor may occur.

FIG. 2 illustrates a simplified one-line diagram of the electric power transmission system 100 having a broken conductor 142 of a power transmission line 108. The electric power transmission system has a broken transmission line 108 with a broken conductor with segments 108X and 108Y. Note that, as used herein, a broken conductor may refer to a conductor breaking (e.g., snapping), a jumper opening, or any other phenomenon that creates a physical discontinuity in the conductor from a source to a load.

Once the conductor of the transmission line 108 breaks, there may be arcing between line segments 108X and 108Y for a duration in which dielectric strength decreases locally. As gravity moves the conductor segments 108X and 108Y further apart from each other, the dielectric strength of the air would regain and the arc will eventually break. In the illustrated embodiment, the broken conductor 142 is in midair following the extinguishing of an arc. Systems and methods described below may improve line monitoring technology by detecting the broken conductor 142 based on charging current and a phase angle between voltage and current, for example, while the conductor is in midair (e.g., following an arc but before the conductor contacts the ground).

Conventionally, power transmission systems wait until the transmission line falls and contacts the ground or another transmission line to determine that a fault has occurred. However, allowing a conductor electrically coupled to a power source, referred to as a live conductor, to contact the ground or another transmission line may cause instability, power losses, and create unsafe conditions. As described below, a protection system 180 may be used to disconnect a broken conductor from the power source 102 to prevent the conductor from contacting the ground while the conductor is live (i.e., while the conductor is in midair). That is, while the transmission line 108 is falling from height 150, the protection system 180 may detect the broken conductor before it contacts the ground and signal power system equipment to trip and remove power from the broken conductor to improve safety, stability, and reliability of the electronic power transmission system 100 by avoiding overcurrents, imbalances, or other undesirable scenarios.

FIG. 3 is a block diagram of a protection system 180 that detects a broken conductor on a transmission line of the electric power transmission system 100. In the illustrated embodiment, the protection system 180 includes an intelligent electronic device (IED) 182, current transformer(s) (CTs) 184 and potential transformer(s) (PTs) 186 (e.g., current transformers and/or potential transformers), and a circuit breaker 190.

As used herein, the IED 182 may refer to any microprocessor-based device that monitors, controls, automates, and/or protects monitored equipment within the electric power transmission system 100. Such devices may include, for example, remote terminal units, differential relays, distance relays, directional relays, feeder relays, overcurrent relays, programmable logic controllers (PLCs), programmable automation controllers, input and output modules, digital sample publishing units, merging units, and the like. The term IED may be used to describe an individual IED or a system comprising multiple IEDs.

In the illustrated embodiment, the IED 182 includes a bus 200 connecting a processor 202 or processing unit(s) to a memory 204, a computer-readable storage medium 206, input circuitry 208, and output circuitry 210. The computer-readable storage medium 206 may include or interface with software, hardware, or firmware modules for implementing various portions of the systems and methods described herein. The computer-readable storage medium 206 may be the repository of one or more modules and/or executable instructions configured to implement any of the processes described herein. In some embodiments, the computer-readable storage medium 206 and the modules therein may all be implemented as hardware components, such as via discrete electrical components, via a Field Programmable Gate Array ("FPGA"), and/or via one or more Application Specific Integrated Circuits ("ASICs").

The processor 202 may be configured to process inputs received via the input circuitry 208. The processor 202 may operate using any number of processing rates and architectures. The processor 202 may be configured to perform various algorithms and calculations described herein using computer executable instructions stored on computer-readable storage medium 206. Processor 202 may be embodied as a microprocessor, a general purpose integrated circuit, an ASIC, a FPGA, and/or other programmable logic devices.

In the illustrated embodiment, the input circuitry 208 receives electric current and voltage signals from the current transformer 184 and the voltage transformer 186 respectively, transforms the signals using respective potential transformer(s) 188 and 189 to a level that may be sampled, and samples the signals using, for example, ND converter(s) 218 to produce digitized analog signals representative of measured current and voltage on the transmission line. Similar values may also be received from other distributed controllers, station controllers, regional controllers, or centralized controllers. The values may be in a digital format or other format. In certain embodiments, the input circuitry 208 may be utilized to monitor current signals associated with a portion of an electric power transmission system. Further, the input circuitry 208 may monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 218 may be connected to the processor 202 by way of the bus 200, through which digitized representations of current and voltage signals may be transmitted to the processor 202. As described above, the processor 202 may be used to monitor and protect portions of the electric power transmission system, and issue control instructions in response to the same (e.g., instructions implementing protective actions).

The processor 202 may effect a control operation on the electric power transmission system 100 via the output circuitry 210. The output circuitry 210 may include one or more alarms 222 and/or protection circuitry 224. The one or more alarms 222 may include LEDs, a display screen to display a notification, a transceiver to communicate with one or more other intelligent electronic devices and/or a central monitoring station, or the like. In the illustrated embodiment, the processor 202 may control operation of the circuit breaker 190 upon determining that a broken conductor is present on the transmission line. In some embodiments, the processor 202 may cause the transceiver to send a signal indicating a distance to the broken conductor. Further, the processor 202 may activate the alarms 222 upon determining that the broken conductor is present. As explained below, the processor 202 may provide an alarm or send a signal via the transceiver without opening the circuitry breaker 190 depending upon the conditions detecting on the power transmission line. In the illustrated embodiment, the input circuitry 208 includes a human-to-machine interface (HMI) 216 and the output circuitry 214 includes communication circuitry 214. The HMI 216 may further include outputs (e.g., display) and the communication circuitry 214 may include a transceiver that sends and/or receives signals.

Figure 4:
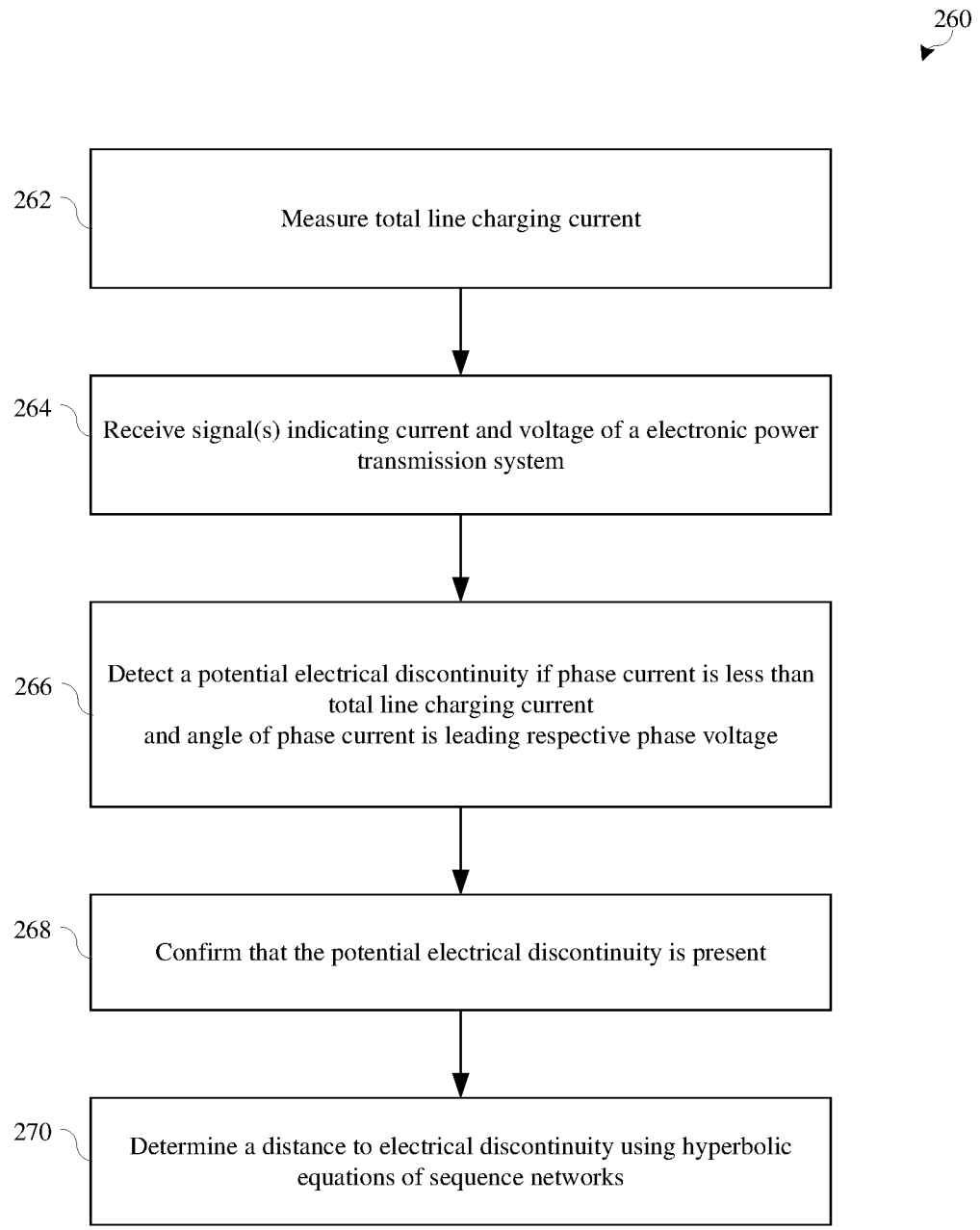
FIG. 4 is a flow diagram of a process performed by the IED of FIG. 2 to detect the broken conductor, in accordance with an embodiment.
Figure 5:
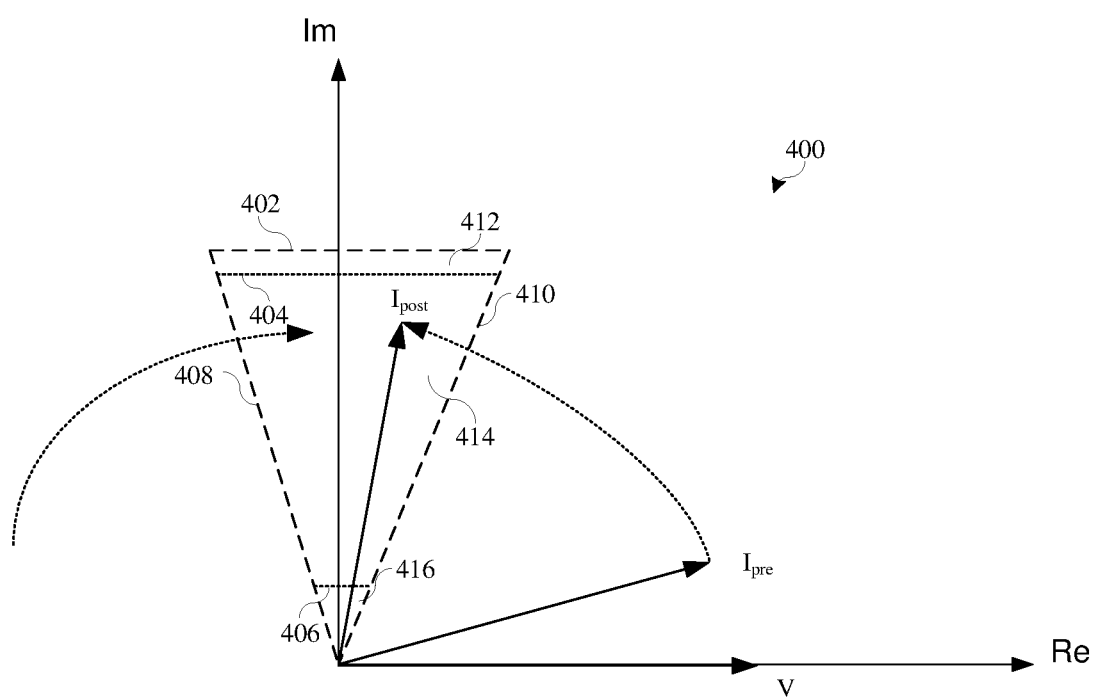
FIG. 5 is a phasor diagram of the voltage and current of the transmission line having the broken conductor of FIG. 2, in accordance with an embodiment.
Figure 6:
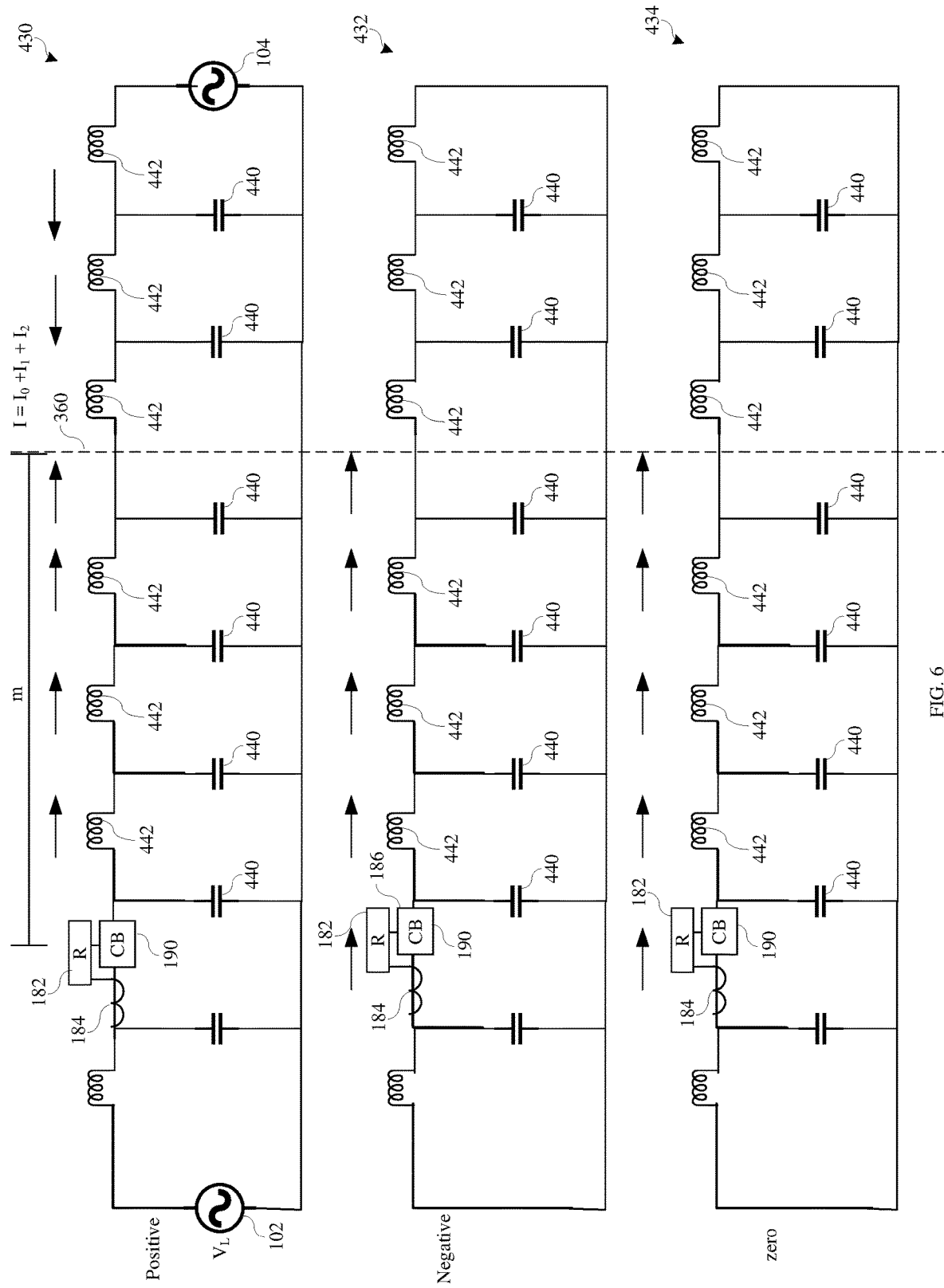
FIG. 6 is a circuit diagram of sequence network having a broken conductor on the transmission line, in accordance with an embodiment.

FIG. 4 is a flow diagram of a process 260 performed using the methods described in conjunction with FIGS. 5 and 6 to determine whether a broken conductor is present on the transmission line. Executable instructions may be stored in the memory 204 and/or the computer-readable storage medium 206 (e.g., code) to cause the processor 202 of the IED to perform the process 260.

In the illustrated embodiment, the processor 202 may retrieves an amount of line charging current (block 262) for a length transmission line. For instance, the line charging current may be stored in the memory 204 and/or the computer-readable storage medium 206. The line charging current may be acquired from the HMI 216, via the communication circuitry 214, or may be determined via the processor 202. The line charging current, also referred to as the shunt capacitance charging current, may be the current discharged from the capacitively stored energy for a given length of the transmission line without a load. The line charging current may include current due to parasitic capacitance between the transmission line and the ground and/or other lines. Transmission lines may have considerable currents due to the capacitance charged on the line during operation that may be detected by the IED 182. The processor 202 may receive signal(s), via the input circuitry 208, indicating current and voltage of the electric power transmission system 100 (block 264). As explained above, the processor 202 may obtain digitized representations of the analog signal of the current and the voltage on the transmission line 108 via the A/D converter 218. The processor 202 may determine that a potential broken conductor may be present on the transmission system (block 266). In the illustrated embodiment, the processor 202 may compare a magnitude of the current on the transmission line 108 measured via the input circuitry 208 to the line charging current stored in the memory 204. The processor 202 may determine that broken conductor is present based at least in part on the current on the transmission line being less than the line charging current. For example, parasitic capacitance may be evenly distributed across a line. In this example, if a conductor breaks at approximately half the length of the transmission line 108, the processor 202 may measure approximately half of the line charging current due to being electrically coupled to approximately half of the capacitance remaining on the line.

Further, the processor 202 may determine whether the current leads the leads the voltage by approximately 90 degrees. If the current leads the voltage by approximately 90 degrees, then a potential broken conductor may be present on the transmission line 108. In some embodiments, the processor 202 may determine whether the phase current leads the voltage by 90 degrees within a tolerance (e.g., 2 degrees, 5 degrees, 10 degrees, 20 degrees, etc.). In the illustrated embodiment, if the processor 202 determines that both the magnitude of the current on the transmission line 108 is less than the total line charging current and the current leads the respective voltage (e.g., by approximately 90 degrees within a tolerance), the processor 202 may determine that a potential broken conductor may be present on the transmission line.

The processor 202 may confirm whether the broken conductor is present on the transmission line 108 (block 268). FIG. 5 is a phasor diagram 400 of current and voltage on the transmission line 108. The processor 202 may periodically store voltage and/or current measurements in the memory 204 during operation. Upon determining that a potential broken conductor may be present, the processor 202 may retrieve the voltage and current measurements from the memory 204 for times prior to the potential broken conductor. The voltage and current measurements stored in the memory 204 may be used to analyze electrical characteristics of the transmission line 108. For example, the processor 202 may determine a phase difference between voltage and current periodically. The phase difference between voltage and current stored in the memory 204 may then be compared to later phase differences between voltage and current upon detecting a potential broken conductor of the transmission line.

As mentioned above, the processor 202 may compare the phase difference between $I_{post}$ and voltage to angle boundary conditions 408 and 410. For example, the processor 202 may detect a potential broken conductor if the phase difference between the voltage and current may be approximately 90 degrees with the current leading the voltage. In the illustrated embodiment, the processor 202 may detect the potential broken conductor if the phase difference between current and voltage is between the angle boundary conditions 408 and 410 with current leading the voltage. Note that the processor 202 may detect a potential broken conductor if the phase difference shifts from greater than angle boundary condition 408 to be within the boundary conditions 408 and 410, or if the phase difference shifts from less than angle boundary condition 410 to be within angle boundary conditions 408 and 410

Further, the processor 202 may establish boundary conditions that allow for tolerances depending on the operating conditions of the transmission line 108. The processor 202 may compare the magnitude of $I_{post}$ with current magnitude boundary conditions 402, 404, and 406. The current magnitude boundary conditions may be based on previous conditions associated with broken conductors. For example, the boundary condition 402, when exceeded, may be associated with electrical properties other than broken conductors, such as downstream tripping of another circuit breaker. If the magnitude of $I_{post}$ is between current magnitude boundary conditions 402 and 404 or between current magnitude boundary conditions 406 and zero, it may indicate a likelihood that a broken conductor may be present. The processor 202 may send a signal to generate an alarm to notify an operator of the potential broken conductor when $I_{post}$ falls within an alarm zone 412 and 416. If the magnitude of $I_{post}$ is between boundary conditions 404 and 406 in trip zone 414, the processor 202 may confirm that a broken conductor is present and send a signal to open a circuit breaker.

As explained below with respect to FIG. 7, to confirm the potential broken conductor, the processor 202 may calculate a change in phase difference from $I_{pre}$ and V to $I_{post}$ and V. Note that the processor 202 may determine whether the change in phase difference is towards or away from a 90 degree phase difference with current leading the voltage. If the change is away from a 90 degree phase difference, then the processor 202 may determine that the change in phase difference is not caused by a broken conductor. For example, the shift may be due to charging or startup conditions. If the change in phase difference is greater than a first threshold and below a second threshold, the processor 202 may send a signal to control an alarm to indicate that a potential broken conductor may be present. If the change in phase difference is greater than the second threshold, the processor 202 may control operation of a circuit breaker to disconnect the broken conductor from the power transmission system 100.

The processor 202 may then determine a distance to the broken conductor (block 270), for example, using equations of sequence networks. Note that the steps executed by the processor 202 may be performed in any suitable order. FIG. 6 is a circuit diagram of a sequence network for the power transmission system 100 having the broken conductor 142 at broken conductor point 360. The sequence network includes a representative positive sequence network 430, a representative negative sequence network 432, and a representative zero sequence network 434. Each circuit includes parasitic capacitance 440 and line inductance 442. The parasitic capacitance 440 may cause the IED 182 to detect an amount of current of the transmission line while a broken conductor is present due to the parasitic capacitance 440 and/or the parasitic inductance 442. Current of the positive sequence, the negative sequence, and the zero sequence may be defined according to Equation 1:

$$I = I_0 + I_1 + I_2 \quad \text{Eq. 1}$$

where $I_0$ is a zero sequence current, $I_1$ is a positive sequence current, and $I_2$ is a negative sequence current.

Using transmission line equations in sequence networks, the current in the conductor at the broken conductor point may be given by a long form equation:

$$I = 0 = \left[ I_L \cosh(\gamma_1 m) - V_L \left( \frac{\sinh(\gamma_1 m)}{Z_{C1}} \right) \right] + \left\{ I_{0L}[\cosh(\gamma_0 m) - \cosh(\gamma_1 m)] - V_{0L}\left[ \left( \frac{\sinh(\gamma_0 m)}{Z_{C0}} \right) - \left( \frac{\sinh(\gamma_1 m)}{Z_{C1}} \right) \right] \right\} \quad \text{Eq. 2}$$

where m is the distance to the broken conductor, $I_L$ is the current of the conductor measured by the local relay 182, $\gamma_1$ is a propagation constant of the positive sequence network, $V_L$ is a voltage at the relay 182, $Z_{C1}$ is a characteristic impedance of the positive sequence network, $I_{0L}$ is the current of the zero sequence network at the relay 182, $\gamma_0$ is a propagation constant of the zero sequence network, $V_{0L}$ is a voltage of the zero sequence network at the relay 182, $Z_{C0}$ is a characteristic impedance of the zero sequence. Note that I, in equation (2), is zero because, at the broken point, the line ends and the load gets electrically disconnected from the transmission line. The values $\gamma_0$, $\gamma_1$, $Z_{C0}$, and $Z_{C1}$ may be given by:

$$\gamma_0 = \frac{1}{\sqrt{L_0 C_0}} \quad \text{Eq. 3}$$

$$\gamma_1 = \frac{1}{\sqrt{L_1 C_1}} \quad \text{Eq. 4}$$

$$Z_{C0} = \sqrt{\frac{L_0}{C_0}} \quad \text{Eq. 5}$$

$$Z_{C1} = \sqrt{\frac{L_1}{C_1}} \quad \text{Eq. 6}$$

where $L_0$ and $L_1$ are the per unit length inductance of the zero sequence component and the positive sequence component respectively and $C_0$ and $C_1$ are the per unit length capacitances of the zero sequence component and the positive sequence component respectively.

The processor 202 may calculate the location of the broken conductor iteratively using equation (2). In some embodiments, a simplified formula may be used that provides a closed form solution. In equation (2), the terms between the curly brackets have been shown by simulation to have a negligible effect. As such, those terms may be approximated such that:

$$0 \approx \left\{ I_{0L}[\cosh(\gamma_0 m) - \cosh(\gamma_1 m)] - V_{0L}\left[ \left( \frac{\sinh(\gamma_0 m)}{Z_{C0}} \right) - \left( \frac{\sinh(\gamma_1 m)}{Z_{C1}} \right) \right] \right\} \quad \text{Eq. 7}$$

The remaining terms from equation (2) associated with the positive sequence may therefore be approximated as:

$$0 = \left[ I_L \cosh(\gamma_1 m) - V_L \left( \frac{\sinh(\gamma_1 m)}{Z_{C1}} \right) \right] \quad \text{Eq. 8}$$

Equation (4) may further be simplified to a short form equation such that a distance to the broken conductor location is given by:

$$m = \frac{1}{\gamma_1} \tanh^{-1}\left( \frac{I_L * Z_{C1}}{V_L} \right) \quad \text{Eq. 9}$$

The processor 202 may determine a location of the broken conductor using equation (9). In certain embodiments, the distance given by equation (9) may then be used to more accurately approximate equation (2). While sequence components are described herein, a similar process may be performed using Clark's transformation. By utilizing the closed form equation (9), the IED 182 may calculate a distance at a faster rate than if the long form equation is used in an iterative manner. Further, by calculating distance at a faster rate, control actions may be taken sooner which may increase the likelihood that the control operation is performed prior to the broken conductor contacting the ground or another transmission line.

Figure 7:
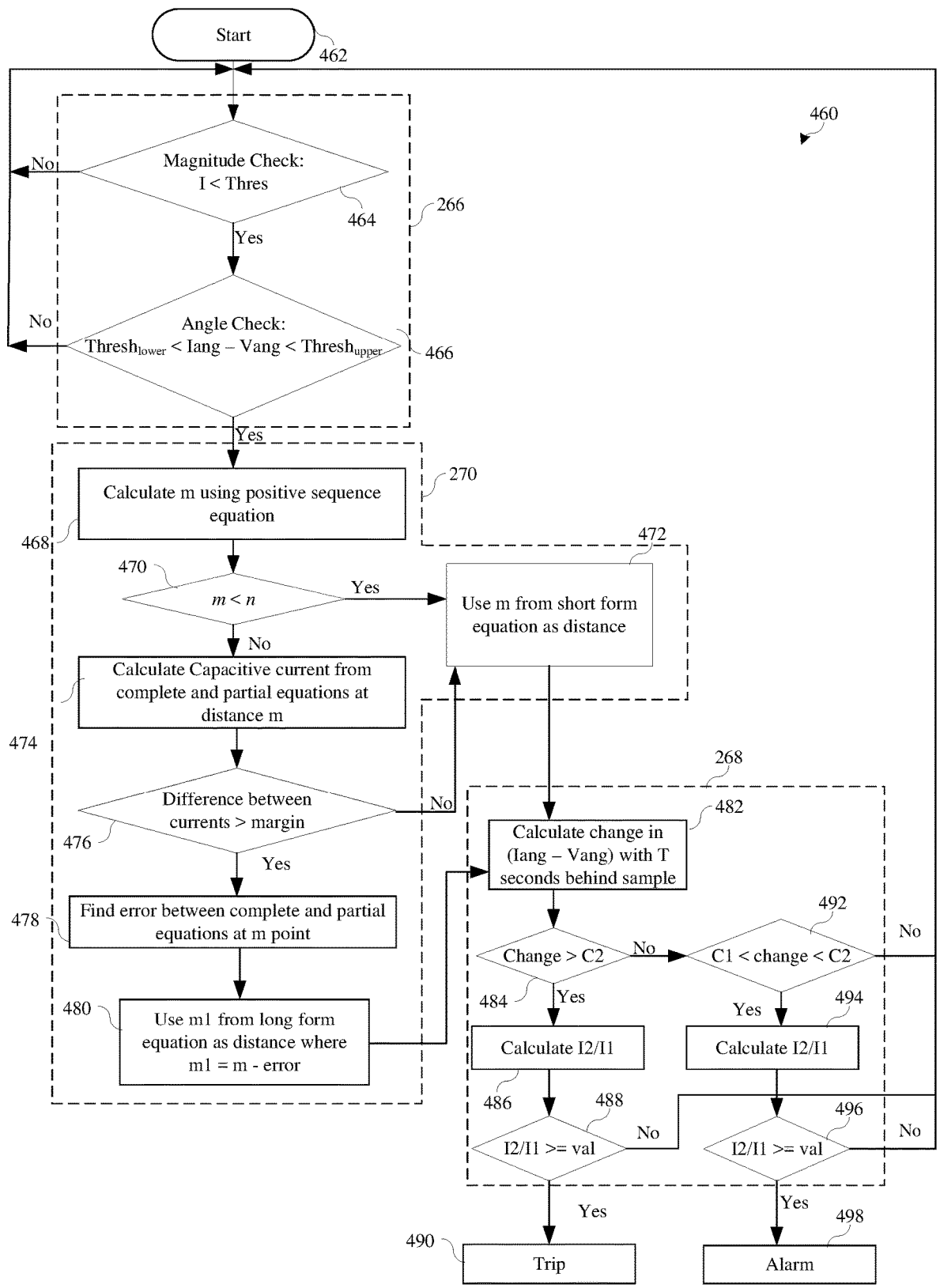
FIG. 7 is a detailed flow diagram of the process of FIG. 4 performed by the IED, in accordance with an embodiment.

FIG. 7 is a detailed flow diagram a process 460 performed at blocks 266-270 of FIG. 4 to determine whether a broken conductor is present. While the process is depicted with steps performed in a given order, any suitable order of the steps may be performed. The processor 202 may begin (block 462) by performing a magnitude check by calculating a value of the current (block 464). The magnitude check may be compared to a max threshold. The max threshold may be specified as:

$$\text{Max Threshold} = \frac{V}{Z_{C1}} \tanh(\gamma_1 * k * LL) \quad \text{Eq. 10}$$

where V may be a latest value of voltage, $Z_{C1}$ is defined with respect to equation (6), $\gamma_1$ is defined with respect to equation (4), k is a constant, and LL is the line length. The constant k may be obtained from user input via the HMI 216 or from the computer readable storage medium 206 as a preset setting.

The processor 202 may perform an angle check by calculating the value of a phase difference between the current and voltage (block 466). If the difference between the current angle and the voltage angle is less than a lower threshold (e.g., 70°, 80°, 85°, etc.) or greater than an upper threshold (e.g., 95°, 100°, 110°, etc.), then the process may begin again (block 462). If the difference between the current angle and the voltage angle is between the upper and lower thresholds, the process 460 may continue and perform distance calculations.

Figure 8:
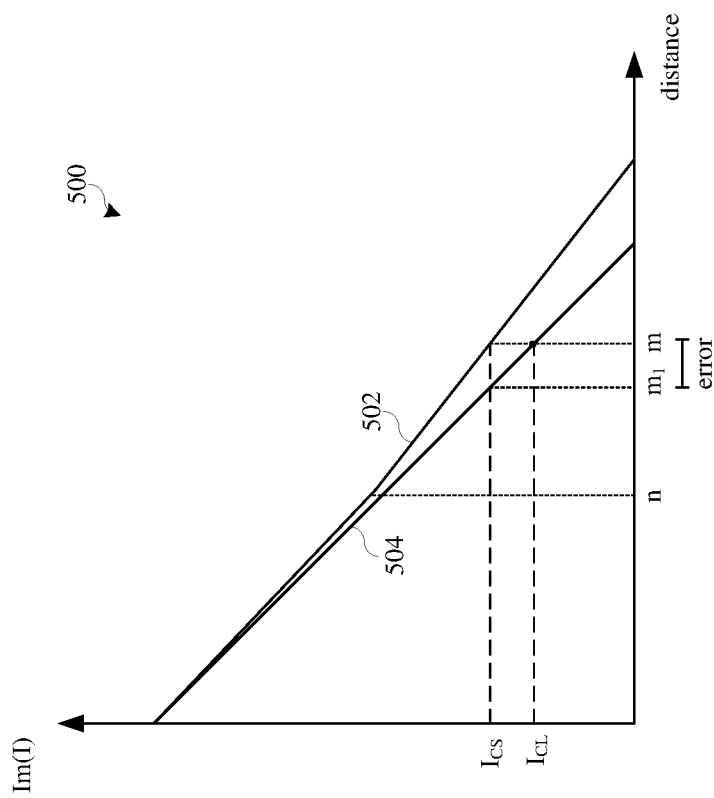
FIG. 8 is plot of imaginary parts of charging currents with respect to distance to the broken conductor of FIG. 2, in accordance with an embodiment.

The process performed to determine the distance (block 270) is described with respect to FIGS. 7 and 8. FIG. 8 shows a plot 500 of the imaginary part of the current from the short form and the long form equation with respect to the distance. The line 502 represents values derived from the short form equation (9) and the line 504 represents values derived from the long form equation (2). The long form equation may provide a more accurate estimate of the distance, and the short form equation may be faster to compute. An increased error may be present in the short form equation as the distance to the broken conductor increases. The threshold value n may be a value associated with distances in which the positive sequence distance of equation (9) is approximately equal to the long form equation (2), In the illustrated embodiment, the distance m to the broken conductor may be calculated using the short form equation (9). To obtain a more accurate measurement, the processor 202 may determine distance $m_1$ from the long form equation using the short form equation distance m as an input to the long form equation. That is, $m_1$ may be calculated to reduce the error in the distance m from the short form equation.

Referring back to FIG. 7, the processor 202 may calculate the distance to the broken conductor using the positive sequence equation (9) (block 468). The processor 202 may compare the distance m to the threshold value n (diamond 470). The processor 202 may utilize m as the distance to the broken conductor if m is less than the threshold value n (block 472). If m is greater than n, an increased error is associated with using the positive sequence equation (9). As such, the processor 202 may then calculate the imaginary part of the capacitive current from the long form equation ($I_{CL}$) and the imaginary part of the capacitive current from the short form equation ($I_{CS}$) at m (block 474). While the imaginary part is used in the illustrated example, the real part or both may be used in other embodiments. The difference between the currents, shown in FIG. 8 at distance m as $I_{CS}$ and $I_{CL}$, may be compared to a margin (diamond 476). If the difference is less than the margin, the distance m may be used (block 472). If the difference is greater than the margin, the processor 202 may calculate an error between the long form and short form equations from m (block 478). That is, the distance m of the short form equation may be used to calculate $m_1$ of the capacitive current of the long form equation to correct for the error between m and $m_1$. The processor 202 may then use $m_1$ from the long form equation (2) as distance where $m_1$ accounts for the error in m (block 480).

The processor 202 may then confirm that the broken conductor is present based on a change in the phase difference between the current (Iang) and the voltage (Vang) using a sample prior to the potential broken conductor and a sample after detection (e.g., over T seconds) of the potential broken conductor (block 482), as described with respect to FIG. 5. If the change is greater than a threshold value (C2) (diamond 484), the processor 202 may determine whether a ratio of the negative sequence current to the positive sequence current is greater than threshold value (val) (block 486 and diamond 488). The threshold value may be a threshold above which it may be suspected that an imbalance condition has been created. If the threshold value is exceeded, the processor 202 may send a signal to cause the circuit breaker 190 to open (block 490). The processor 202 may compare the change to threshold value (C1). If the change is less than C1, the process may begin again (block 462). Note that the threshold value C1 may be the minimum angle change between Iang and Vang that is associated with broken conductors. C2 may be an angle change beyond which a broken conductor can be declared to have occurred.

If the processor 202 determines that the change between Iang and Vang over T seconds is between C1 and C2 (e.g., there is a likelihood that a broken conductor may be present but not a sufficient confidence to trip) (diamond 486), the processor 202 may perform similar calculations and comparisons as block 486 and diamond 488 to determine whether a ratio of the negative sequence current to the positive sequence current is greater than "val" in an alarm condition (block 494 and diamond 496). If the threshold value is exceeded, the processor may send, via the communication circuitry 214 and/or the output circuitry 210, a signal indicating a sufficient confidence that a broken conductor may be present (block 498). The signal may be sent to control an alarm 222 (e.g., LEDs, auditory alarms, etc.) or to another IED or a central monitoring station.

In some embodiments, the processor 202 may determine the distance to the broken conductor based on a comparison between the capacitance current of the broken conductor phase and a total line shunt capacitance current. For instance, the processor 202 may determine the distance to the broken conductor to be a percentage of the broken conductor capacitance current of the total line shunt capacitance current. As an example, if a conductor were broken at 60% of the line length, the processor 202 may detect approximately 60% of the total line shunt capacitance as the capacitance current.

Systems and methods described herein improve IED technology by determining whether a broken conductor is present in a transmission line of a power transmission system prior to the broken conductor contacting the ground or a transmission line. If a broken conductor is present, the intelligent electronic device may perform control actions on the power transmission system. By controlling the power transmission such that the broken conductor is disconnected to prevent the broken conductor from contacting the ground or another line while the broken conductor is live, the IED may reduce instability and improve reliability in the power transmission system. In some embodiments, the improved IED technology may calculate distances at faster rates using a short form equation which may increase the speed at which a distance to the broken conductor is located which may increase a likelihood at which control operations may be performed prior to creation of a fault.

As mentioned above, conventional IED technology may detect an overvoltage, an undervoltage, an overcurrent, or an undercurrent upon a conductor contacting the ground or a transmission line. However, a broken conductor that receives power and contacts the ground or a transmission line may cause instability, reliability, and safety issues. As such, the functioning of the IED is improved by detecting a broken conductor prior to contacting the ground or transmission lines (e.g., midair). That is, by utilizing the line charging current compared to the current on the conductor and the phase difference between current and voltage, IED technology may perform new functionality by detecting a broken conductor before contacting the ground or another transmission line. By detecting the broken conductor and disconnecting the broken conductor from the power transmission system, IEDs may prevent the instability, reliability, and safety issues from occurring. Additionally, the functioning of the power transmission system that utilizes an IED that detects broken conductors may be improved by reduced instability and improved reliability.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system for detecting a broken conductor in a transmission line of a power transmission system, wherein the system comprises:
    a memory;
    a processor operatively coupled to the memory, wherein the processor is configured to:
        receive a signal indicating current and voltage on the transmission line;
        determine that the broken conductor is present on the transmission line based at least in part on a magnitude of the current being less than a line charging current of the transmission line and a phase difference between current and voltage of the transmission line; and
        effect a control operation based on the determined broken conductor.

2. The system of claim 1, wherein the processor is configured to determine a distance to the broken conductor.

3. The system of claim 2, wherein the distance is determined based at least in part on a positive sequence portion of hyperbolic equations of a sequence network of the power transmission system.

4. The system of claim 2, wherein the distance is determined based at least in part on a positive sequence portion, a negative sequence portion, and a zero sequence portion of hyperbolic equations.

5. The system of claim 1, wherein the processor is configured to determine that the broken conductor is likely by comparing a change in phase difference between the current and the voltage over a period of time to a first threshold and a second threshold.

6. The system of claim 5, wherein the processor is configured to send a signal to control an alarm if the change in the phase difference is greater than the first threshold and less than the second threshold.

7. The system of claim 1, wherein the processor is configured to confirm the broken conductor by comparing a change in the phase difference between the current and the voltage over a period of time to a threshold.

8. The system of claim 5, wherein when the phase difference between current and voltage exceeds the threshold, the control operation comprises signaling a circuit breaker to open.

9. The system of claim 1, wherein the processor is configured to determine a distance to the broken conductor based on a comparison between a capacitance current of the broken conductor to a total line shunt capacitance current.

10. A non-transitory, computer readable medium comprising instructions configured to be executed by a processor to cause the processor to:
    receive a signal indicating current of the transmission line;
    detect a potential broken conductor of the transmission line based on a magnitude of the current being less than a line charging current of the transmission line and a phase difference between the current and a voltage of the transmission line with the current leading the voltage of the transmission line; and
    confirm that the potential broken conductor is present by comparing a magnitude of the current prior to the potential broken conductor to a magnitude of the current following the broken conductor.

11. A non-transitory, computer readable medium comprising instructions configured to be executed by a processor to cause the processor to:
    receive a signal indicating current of the transmission line;
    detect a potential broken conductor of the transmission line based on a magnitude of the current being less than a line charging current of the transmission line and a phase difference between the current and the voltage with the current leading the voltage of the transmission line; and
    confirm that the potential broken conductor is present by comparing a magnitude of the current prior to the potential broken conductor to a magnitude of the current following the broken conductor.

12. The non-transitory, computer readable medium of claim 11, comprising instructions configured to cause the processor to detect the potential broken conductor by comparing the phase difference between current and voltage be between a first value and a second value.

13. The non-transitory, computer readable medium of claim 12, wherein the first value and the second value allow for a tolerance from current leading the voltage by 90 degrees.

14. The non-transitory, computer readable medium of claim 11, comprising instructions configured to cause the processor to determine a first distance to the potential broken conductor using a short form equation.

15. The non-transitory, computer readable medium of claim 14, comprising instructions configured to cause the processor to calculate a capacitive current at the first distance using both the short form equation and a long form equation.

16. The non-transitory, computer readable medium of claim 15, comprising instructions configured to cause the processor to compare a difference between capacitive currents of the long form equation and the short form equation to a margin.

17. The non-transitory, computer readable medium of claim 11, comprising instructions configured to cause the processor to determine a second distance via a long form equation by determining an error in a first distance the potential broken conductor.

18. A method, comprising:
receiving a signal indicating current and voltage on a transmission line; and
determining that a broken conductor is present on the transmission line based at least in part on a magnitude of the current being less than a line charging current of the transmission line and a phase difference between current and voltage of the transmission line.

19. The method of claim 18, comprising opening a circuit breaker based at least in part on a ratio of a negative sequence current to a positive sequence current compared to a preset threshold value.

20. The method of claim 19, comprising sending a signal to an alarm based at least in part on the ratio of the negative sequence current to the positive sequence current compared to the preset threshold value.

21. The method of claim 18, comprising determining the line charging current based on the equation:

$$\text{Max Threshold} = \frac{V}{Z_{C1}} \tanh(\gamma_1 * k * LL)$$

where V is the voltage of the transmission line, Zc1 is a positive sequence impedance, $y_1$ is a propagation constant of the positive sequence network, and LL is a length of the transmission line.

22. The method of claim 18, comprising effecting a control operation based on the determined broken conductor.

* * * * *